(12) United States Patent
Cheah et al.

(10) Patent No.: US 11,994,545 B2
(45) Date of Patent: May 28, 2024

(54) DC RESISTANCE MEASUREMENT CONTACT CHECKING VIA ALTERNATING CURRENT HIGH FREQUENCY INJECTION

(71) Applicant: NATIONAL INSTRUMENTS CORPORATION, Austin, TX (US)

(72) Inventors: Chin-Hong Cheah, Pulau Penang (MY); Tatt-Wee Oong, Penang (MY); Eric Hartner, Austin, TX (US)

(73) Assignee: National Instruments Corporation, Austin, TX (US)

(*) Notice: Subject to any disclaimer, the term of this patent is extended or adjusted under 35 U.S.C. 154(b) by 225 days.

(21) Appl. No.: 17/728,377

(22) Filed: Apr. 25, 2022

(65) Prior Publication Data

US 2022/0365123 A1  Nov. 17, 2022

Related U.S. Application Data

(60) Provisional application No. 63/187,017, filed on May 11, 2021.

(51) Int. Cl.
*G01R 27/16* (2006.01)
*G01R 31/319* (2006.01)

(52) U.S. Cl.
CPC ....... *G01R 27/16* (2013.01); *G01R 31/31924* (2013.01)

(58) Field of Classification Search
CPC ............. G01R 27/16; G01R 31/31924; G01R 31/2879
USPC .................................................. 324/762.01
See application file for complete search history.

(56) References Cited

U.S. PATENT DOCUMENTS

| | | |
|---|---|---|
| 5,063,353 A * | 11/1991 | Gubisch ............... G01R 27/16 702/65 |
| 5,886,530 A | 3/1999 | Fasnacht et al. |
| 6,348,802 B1 | 2/2002 | Cooke |
| 6,661,242 B1 | 12/2003 | Cascella |
| 6,677,744 B1 | 1/2004 | Long |
| 6,697,291 B2 | 2/2004 | Frankowsky |
| 6,762,402 B2 | 7/2004 | Choi et al. |
| 7,741,983 B1 | 6/2010 | Lakshmikanthan et al. |
| 9,322,880 B2 | 4/2016 | Klapper |
| 9,547,044 B2 | 1/2017 | Klapper et al. |
| 9,974,452 B2 | 5/2018 | Bell, Jr. et al. |

(Continued)

*Primary Examiner* — Tung X Nguyen
*Assistant Examiner* — Robert P Alejnikov, Jr.
(74) *Attorney, Agent, or Firm* — Kowert, Hood, Munyon, Rankin & Goetzel, P.C.; Jeffrey C. Hood

(57) ABSTRACT

A test system may be used for obtaining accurate remote sense voltage and/or current values. A measurement instrument may provide a regulated stimulus signal to a device under test (DUT) and measure a DUT signal developed at least partially in response to the stimulus signal. A test circuit may superimpose a test signal over the stimulus signal to cause the DUT signal to be developed further in response to the test signal. The DUT signal may be used to derive a resistance of the path that couples the measurement instrument to the DUT. The measurement instrument may include a source measure unit, the stimulus signal may be a regulated voltage, and the DUT signal may be a sense voltage. The harmonics of the DUT signal may be analyzed to determine a correlation between an amplitude of a measured fundamental frequency of the DUT signal and the resistance of the path.

20 Claims, 10 Drawing Sheets

(56) References Cited

U.S. PATENT DOCUMENTS

| | | | |
|---|---|---|---|
| 2004/0027138 A1* | 2/2004 | Pickerd | G01R 13/22 |
| | | | 324/76.19 |
| 2006/0164108 A1* | 7/2006 | Herbold | H04L 12/10 |
| | | | 324/691 |
| 2008/0204054 A1* | 8/2008 | Wells | G01R 27/16 |
| | | | 324/713 |
| 2009/0021271 A1 | 1/2009 | Bernacchia et al. | |
| 2010/0049453 A1* | 2/2010 | Watanabe | G01R 31/31924 |
| | | | 702/58 |
| 2010/0182024 A1* | 7/2010 | Yu | H04L 12/10 |
| | | | 324/713 |
| 2013/0003804 A1* | 1/2013 | Baney | H04B 17/17 |
| | | | 375/224 |
| 2013/0093444 A1* | 4/2013 | Maniktala | H04L 12/12 |
| | | | 324/713 |
| 2018/0091319 A1* | 3/2018 | Huang | H04L 12/10 |
| 2018/0180652 A1* | 6/2018 | Sestok, IV | G01R 27/16 |
| 2020/0003824 A1* | 1/2020 | Arnold | G01R 31/2894 |

\* cited by examiner

DC RESISTANCE MEASUREMENT CONTACT CHECKING VIA ALTERNATING CURRENT HIGH FREQUENCY INJECTION

PRIORITY CLAIM

This application claims benefit of priority of Patent Application Ser. No. 63/187,017, titled "DC Resistance Measurement Contact Checking via Alternating Current High Frequency Injection", filed on May 11, 2021, which is hereby incorporated by reference as though fully and completely set forth herein.

BACKGROUND OF THE INVENTION

Field of the Invention

This invention relates to measurement and data acquisition systems, including a system and method for DC resistance measurement contact checking via alternating current (AC) high frequency Injection.

Description of the Related Art

Measurement systems are oftentimes used to perform a variety of functions, including measurement of physical phenomena, measurement of certain characteristics or operating parameters of a unit under test (UUT) or device under test (DUT), testing and analysis of physical phenomena, process monitoring and control, control of mechanical or electrical machinery, data logging, laboratory research, and analytical chemistry, to name a few examples.

An example of a device that may be used in measurement systems is a Source-Measure Unit (SMU), which may apply a voltage to a DUT and measure the resulting current, or may apply a current to the DUT and measure the resulting voltage. Many instruments, e.g. an SMU, but also power supplies, digital multimeters, etc., have a 'voltage sense' input to sense the remote voltage at a Device Under Test (DUT—device that is being tested by the instrument) such that the voltage, or any measurement, may be regulated, and feedback obtained at the DUT point rather than at the connection input on the instrument itself. This facilitates more precise and accurate point of measurement and/or regulation of voltage. However, too high a resistance or an open connection on remote sense cables (the cables connecting the DUT to the instrument) can cause issues, damage or at the very least errors in regulation and/or measurement. Improvements in obtaining remote voltage (or other signal) measurements are therefore needed.

Other corresponding issues related to the prior art will become apparent to one skilled in the art after comparing such prior art with the present invention as described herein.

SUMMARY OF THE INVENTION

Embodiments are presented herein of a system and method to obtain accurate remote sense voltage and/or current values. A measurement instrument may provide a stimulus signal to a device under test (DUT) and measure a DUT signal developed at least partially in response to the stimulus signal. A contact check circuit may superimpose a test signal over the stimulus signal to cause the DUT signal to be developed further in response to the test signal. The measurement instrument may receive the DUT signal over a sense path, and may derive an effective resistance of the sense path based at least in part on the DUT signal. The measurement instrument may include a source measure unit, the stimulus signal may be an injected current and the DUT signal may be a sense voltage. The test signal may include square waves. The measurement instrument may also analyze harmonics of the test signal and use results of the analysis to derive the resistance of the sense path.

In some embodiments, the measurement instrument may be a source measure unit (SMU) which may remain coupled to the DUT at all times during the contact check process. When executing a contact check (or cable resistance check), the output voltage generated and regulated by the SMU may remain present and not turned off or disconnected. However, the output voltage may remain regulated and programmed to be 0V. In other words, the SMU control loop may remain active, and the contact check test signal may be injected over the regulated voltage, e.g. over the regulated 0V stimulus provided by the SMU. Once the contact (cable resistance) check has been completed, the contact check test signal may be removed and a programmed voltage, for example a previously programmed voltage, may be restored to be provided at the SMU outputs. Throughout the contact (cable resistance) check process the output of the SMU may remain in regulation at all times with the output programmed to a desired voltage, which may be different, e.g. 0V in some embodiments, than a designated operating voltage of the SMU used for making DUT measurements.

This Summary is intended to provide a brief overview of some of the subject matter described in this document. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
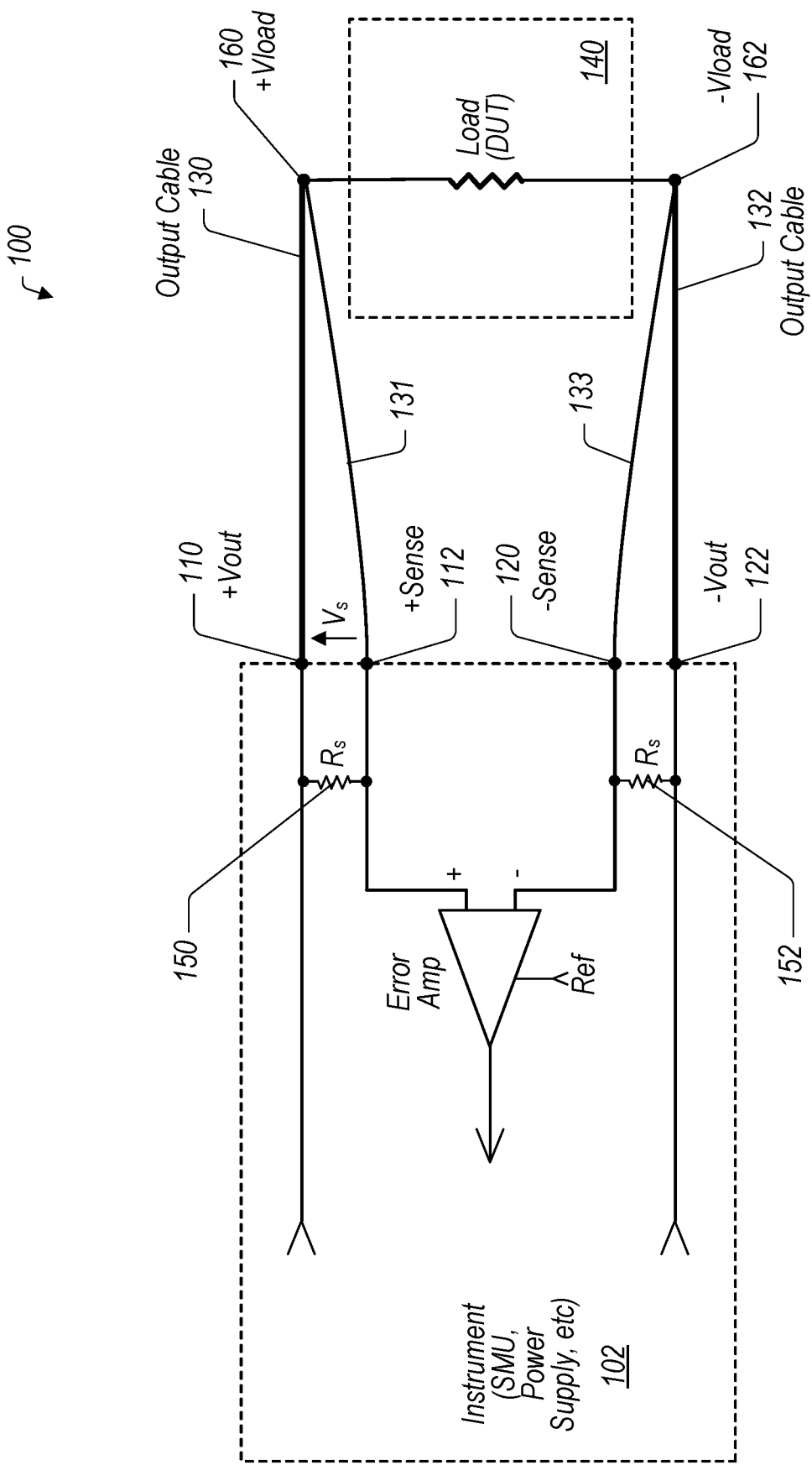
FIG. 1 shows a simplified circuit diagram of an exemplary measurement system with a power supply, according to prior art.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

DETAILED DESCRIPTION OF THE EMBODIMENTS

Terms

The following is a glossary of terms that may appear in the present disclosure:

Memory Medium—Any of various types of non-transitory memory devices or storage devices. The term "memory medium" is intended to include an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of non-transitory memory as well or combinations thereof. In addition, the memory medium may be located in a first computer system in which the programs are executed, or may be located in a second different computer system which connects to the first computer system over a network, such as the Internet. In the latter instance, the second computer system may provide program instructions to the first computer system for execution. The term "memory medium" may include two or more memory mediums which may reside in different locations, e.g., in different computer systems that are connected over a network. The memory medium may store program instructions (e.g., embodied as computer programs) that may be executed by one or more processors.

Computer System (or Computer)—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" may be broadly defined to encompass any device (or combination of devices) having at least one processor that executes instructions from a memory medium.

Processing Element (or Processor)—refers to various elements or combinations of elements that are capable of performing a function in a device, e.g., in a user equipment device or in a cellular network device. Processing elements may include, for example: processors and associated memory, portions or circuits of individual processor cores, entire processor cores, processor arrays, circuits such as an ASIC (Application Specific Integrated Circuit), programmable hardware elements such as a field programmable gate array (FPGA), as well any of various combinations of the above.

Configured to—Various components may be described as "configured to" perform a task or tasks. In such contexts, "configured to" is a broad recitation generally meaning "having structure that" performs the task or tasks during operation. As such, the component can be configured to perform the task even when the component is not currently performing that task (e.g., a set of electrical conductors may be configured to electrically connect a module to another module, even when the two modules are not connected). In some contexts, "configured to" may be a broad recitation of structure generally meaning "having circuitry that" performs the task or tasks during operation. As such, the component can be configured to perform the task even when the component is not currently on. In general, the circuitry that forms the structure corresponding to "configured to" may include hardware circuits.

SMU—Source Measurement Unit—an instrument that combines a sourcing function and a measurement function on the same pin or connector. An SMU may source voltage and/or current and may simultaneously measure voltage and/or current.

TOF sensing—Time of Flight sensing—the measurement of the time taken by an object particle or wave to travel a distance.

DUT—Device Under Test

Various components may be described as performing a task or tasks, for convenience in the description. Such descriptions should be interpreted as including the phrase "configured to." Reciting a component that is configured to perform one or more tasks is expressly intended not to invoke 35 U.S.C. § 112, paragraph six, interpretation for that component.

Remote Sense Measurements

As previously mentioned, many instruments, including SMUs, certain power supplies, digital multimeters and the like feature a "voltage sense" input to sense the remote voltage at a device under test (DUT) in a way that the voltage, or any measurement, is regulated and feedback is obtained at the DUT point rather than at the connection input on the instrument. One such exemplary measurement system 100 that includes a measuring instrument 102 is illustrated in FIG. 1. In a local sense configuration, the measurement results for +Vload and −Vload at DUT 140 may be obtained via sense resistors 150 and 152 when sense nodes +Sense 112 and −Sense 120 are not connected/coupled to the DUT 140 via connecting lines 131 and 133, respectively. In a remote sense configuration, with connecting lines 131 and 133 connecting/coupling sense nodes +Sense 112 and −Sense 120, respectively, to DUT 140, measurement results for +Vload and −Vload at DUT 140 may be obtained directly via sense nodes +Sense 112 and −Sense 120, automatically bypassing sense resistors 150 and 152 due to the respective resistances of resistors 150 and 152 far surpassing the cable resistances of 131 and 133, respectively. The remote sense voltage will hence be obtained directly from sense nodes +Sense 112 and −Sense 120. The (regulated) stimulus voltage +Vout 110 and −Vout 122 is provided to DUT 140 via respective output cables 130 and 132. While this allows for more precise and accurate point of measurement and/or regulation of the voltage, too high a resistance or an open connection on remote sense cables connecting the DUT 140 to the instrument 102 may result in regulation errors and/or measurement errors, and in some cases may even lead to equipment/device damage.

There is a need to ensure +Sense (HS) is connected to +Vload and −Sense is connected to −Vload before sourcing, using remote sense to avoid damage due to open loop operation. An auto-sense resistor (e.g. Rs=1 MΩ) may be positioned between the voltage output and the sense input (sense resistors 150 and 152 shown in FIG. 1) to provide a failsafe, but such a resistance obfuscates whether the sense input connection is from a pure voltage measurement. There is also a high potential for leakage issues given the node sensitivity. Finally, most SMU connections are not impedance controlled as high frequency performance does not generally present a concern.

Figure 2:
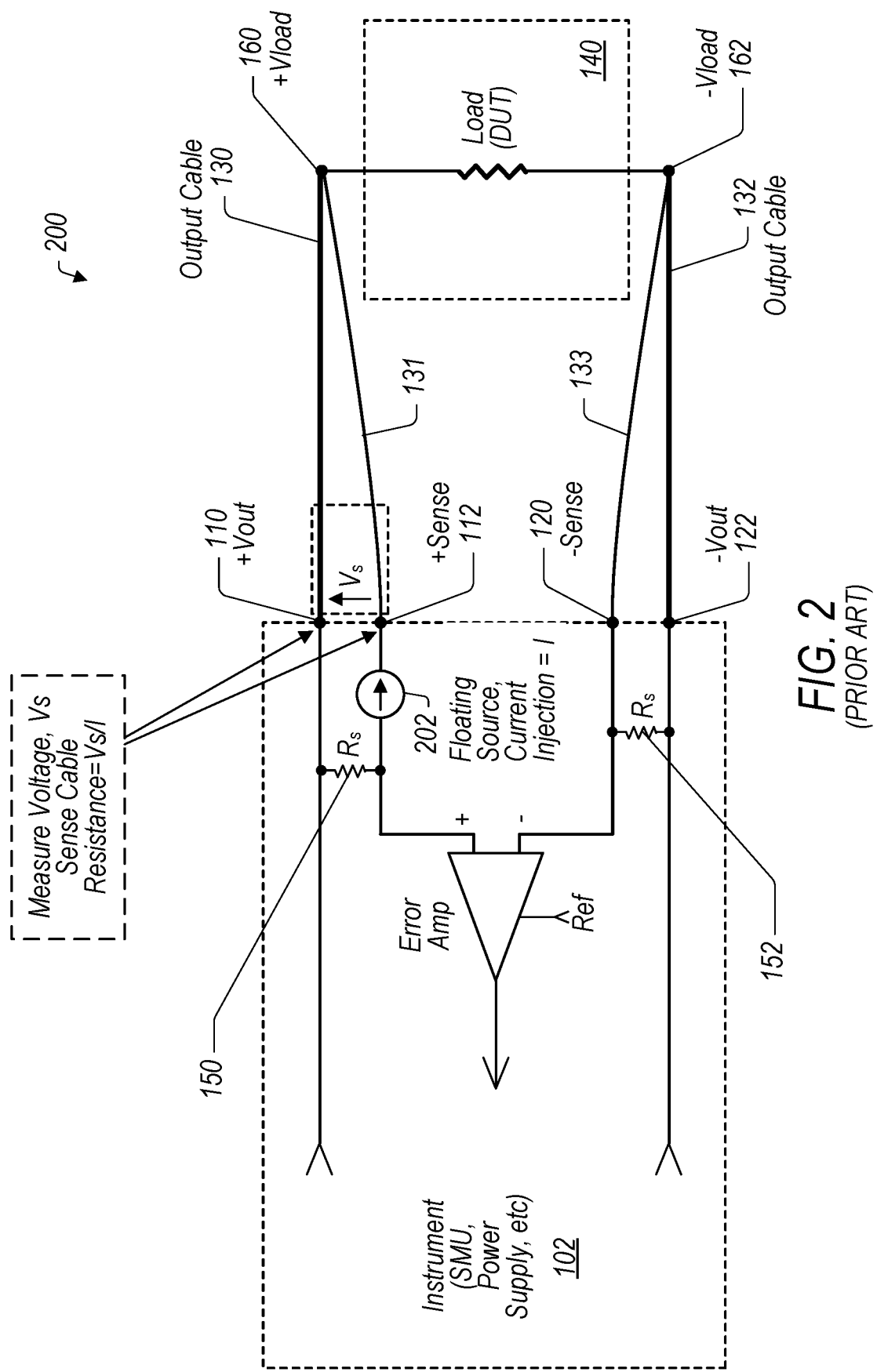
FIG. 2 shows a simplified circuit diagram of an exemplary measurement system with a power supply, in which current is injected into a sense node to measure a voltage, according to prior art.

Current solutions use an injection current into the +Sense and +Vout nodes 112 and 110, respectively, and measure voltage as illustrated in system 200 of FIG. 2. A floating current source 202 is used to inject current into nodes 112 and 110. These solutions require an isolated 'floating' current source, differential amplifier, and an analog-to-digital converter (ADC) to measure the small injected current. With a non-isolated current source, the DUT may draw current and the results therefore become load dependent. Furthermore, limited analog front-end bandwidth (AFE BW) of precision DC instrumentation typically limits measurement resolution.

Improved Measurements

According to some embodiments, an improved measurement methodology may include injecting an AC stimulus (e.g. a square wave) into the HI node (representative of the +Vout node, in reference to FIG. 2) and the inverse of the same stimulus into the HS node (representative of the +Sense node, in reference to FIG. 2.) A local output voltage (V_Local sense), remote sensed voltage (V_Remote sense), and injected current (I_Shunt) may be measured. The timing with respect to the pulse edge may be configured so the measurements can be timed, multiplexed, and averaged or analyzed via fast Fourier transform (FFT) in the frequency domain. Injecting a differential waveform across HI and HS may help minimize the DUT voltage/current deviation. The impact of open/short DUT may also be reduced/minimized. The methodology may be used with a connected auto sense resistor.

Figure 3:
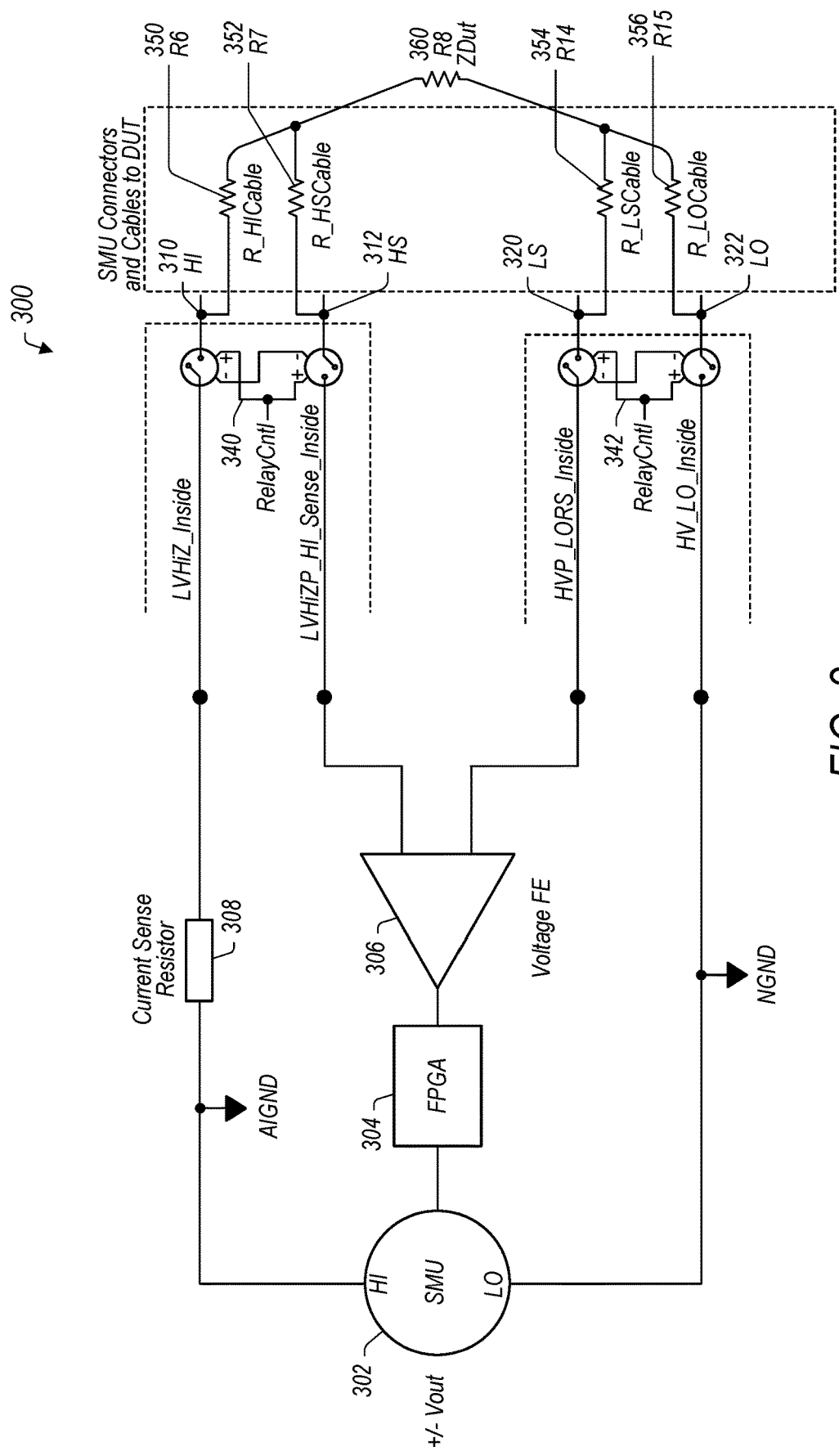
FIG. 3 shows a simplified circuit diagram of an exemplary SMU-based test measurement system which may be used for cable resistance measurements, according to some embodiments.

One measurement system suitable to implement of the above methodology is illustrated by way of system 300 in FIG. 3. System 300 may include sense resistor 308 and relays 340 and 342 which may connect and disconnect the output and load. The voltage front end (FE) 306 may sense the remote voltage true HS (at node 312) and LS (at node 320) differentially, and may feed the measurement back to processing circuitry (exemplified by the FPGA 304) and/or other circuits such that the output +/−Vout of the SMU 302 may be regulated/measured at the load point, ZDut (360). The SMU connecting cables are modeled (represented) by R6 350, R7 352, R14 354, and R15 356. As indicated, R6 represents the cable coupling +Vout (HI) 310 to DUT 360, R7 represents the cable coupling +Sense (HS) 312 to DUT 360, R14 represents the cable coupling −Sense (LS) 320 to DUT 360, and R15 represents the cable coupling −Vout (LO) 322 to DUT 360.

Figure 4:
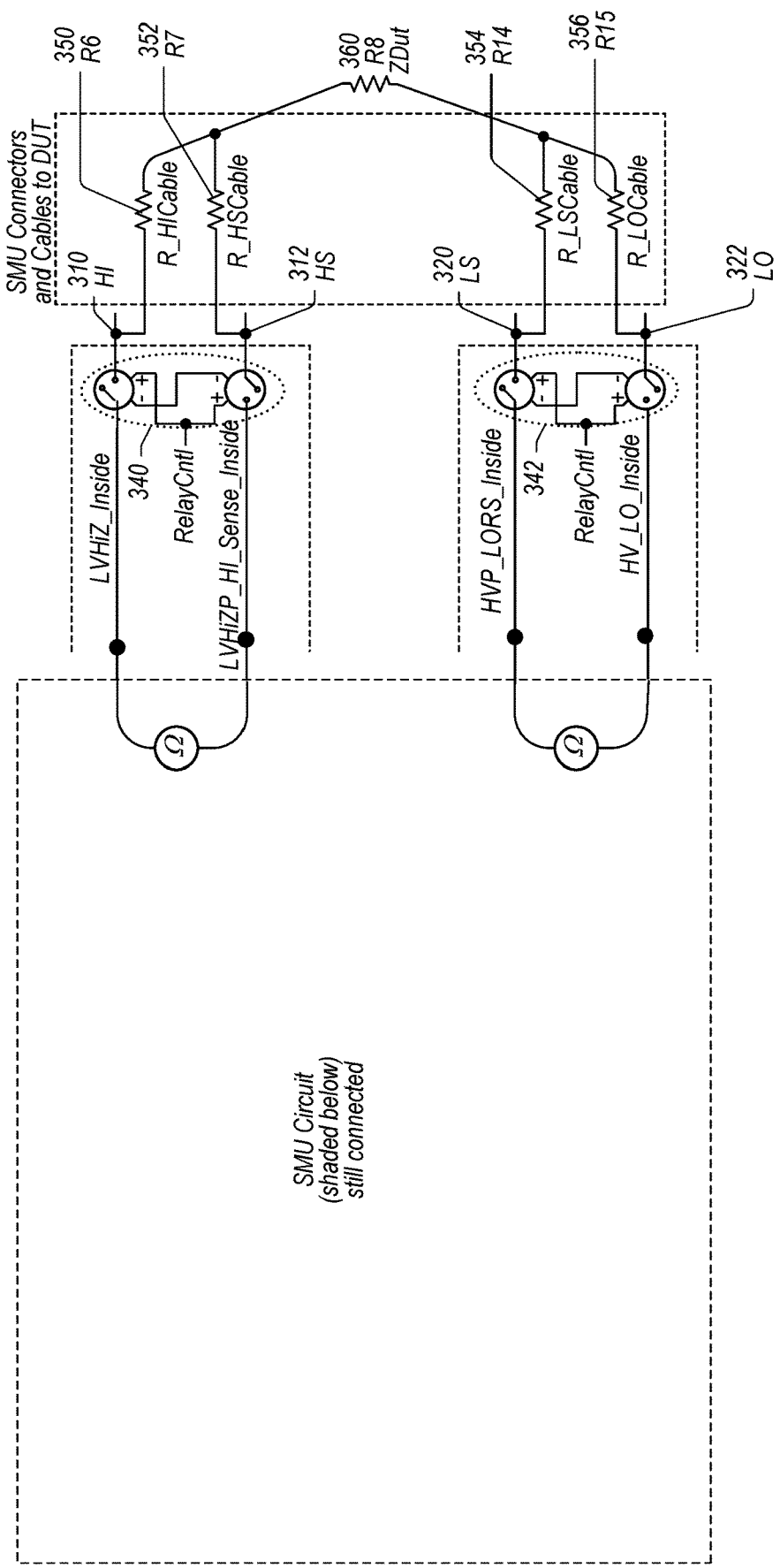
FIG. 4 shows a simplified circuit diagram of an exemplary SMU-based test measurement system, illustrating a targeted cable resistance measurement, according to some embodiments.

FIG. 4 shows a simplified circuit diagram derived from the system 300 shown in FIG. 3, illustrating a targeted cable resistance measurement. As illustrated in FIG. 4, the intent is to measure the resistance of the cables (R6/R7, and R14/R15), while the SMU (circuit) still remains connected to the load 360, providing the regulated stimulus (output) voltage(s) at node(s) 310 and/or 322, respectively. In other words, the output voltage at nodes HI 310 and/or LO 322 may remain regulated and programmed to a specific value, for example 0V. Accordingly, the SMU control loop may remain active, and the contact check test signal may be injected over the regulated voltage, e.g. over the regulated 0V output voltage provided by the SMU. Once the contact (cable resistance) check has been completed, the contact check test signal(s) may be removed and a previously programmed voltage may be restored for the SMU. Throughout the contact (cable resistance) check process the output of the SMU may remain in regulation at all times, although, as noted above, the output may be programmed to a different voltage, e.g. 0V, than a designated operating voltage of the SMU used for taking DUT measurements.

Figure 5:
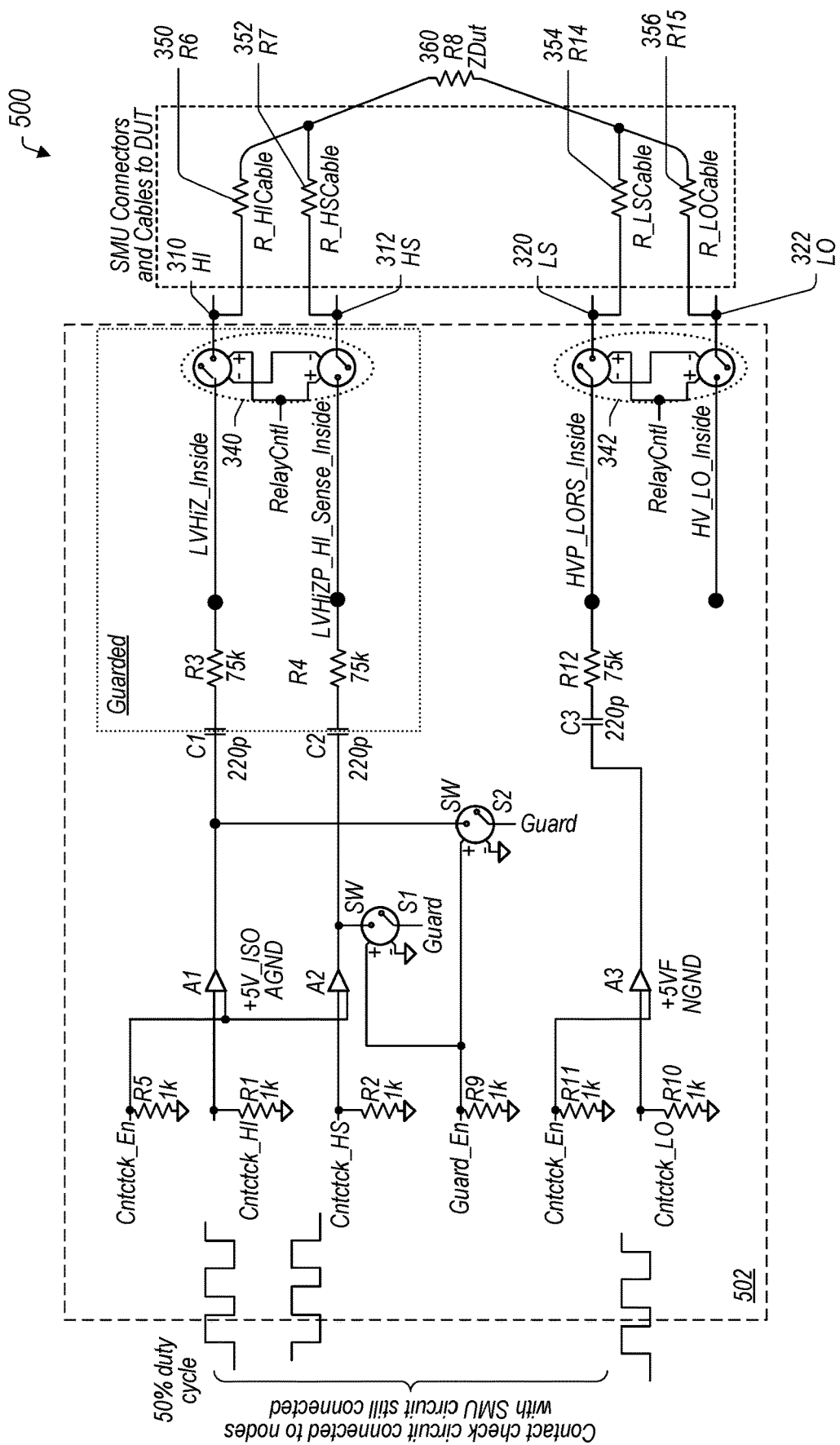
FIG. 5 shows a simplified circuit diagram of an exemplary SMU-based test measurement system with a contact check circuit for measuring cable resistance, according to some embodiments.

FIG. 5 shows a simplified circuit diagram of an exemplary SMU-based test measurement system 500, based on the system 300 shown in FIG. 3, with a contact check circuit 502 for measuring cable resistance. It should be noted that the specific values provided for various resistors/resistances (R1-R12) and capacitors/capacitances (C1-C3) are for exemplary purposes only and may be adjusted/selected as required or desired in different embodiments. As shown in FIG. 5, the contact check circuit (Cntctck) 502 may be used to superimpose a test signal, e.g., square waves (or other waveforms, square waves are provided as one example) on selected nodes as indicated. In the illustrated implementation, test signal waves (in this case square waves) are superimposed onto the HI node 310, HS node 312 and also LS node 320 while the SMU circuit (not shown in FIG. 5) also remains connected to generate the stimulus signal(s), e.g. +Vout at node HI 310 and −Vout at node LO 322. The superimposed square waves are applied via Cntctck_HI, Cntctck_HS, and Cntctck_LO, respectively.

When in contact check mode, A1 and A2 may be used to produce the square wave/test signals that are respectively coupled thru C1 and C2 into the guarded terminals HI 310 and HS 312 through resistors R3 and R4 and relay (or switch) 340. Because of the potential presence of a very low current at the HI 310 and HS 312 terminals, guarding may be used to prevent these low currents from leaking out of the boxed ("Guarded") area where sensitive and low current instrumentation may be located. Guarding is used because C1 and C2 interfaces the contact check injection circuitry from the non guarded portion to the sensitive guarded portion of the circuit 502, when the SMU is in normal operating mode and the contact check function is not being used (e.g. Cntctck_En is not asserted), and the node of capacitors C1 and C2 connected to the sources A1 and A2 are turned off in a high impedance state. To prevent stray currents from leaking out from the guarded area into the unguarded area through the capacitors C1 and C2, guard switches S1 and S2 may be turned on to impose the guard voltage potential onto the 'unguarded' side of the capacitors (e.g. to the left of the capacitors). The guard voltage level may be set to a level such that it forces both plates of capacitor C1 and C2 to be at a similar potential and hence prevent leakage currents from leaking thru C1 and C2 by virtue of having the same voltage potential on both the unguarded and guarded side. The guarding function ensures there is no leakage current, as even a small potential difference, e.g. on the order of 0.5V, might allow significant (e.g. 1 pA or greater) current to leak across these capacitors during normal operation (e.g. when contact check function is off), which may affect measurement sensitivity and accuracy.

Figure 6:
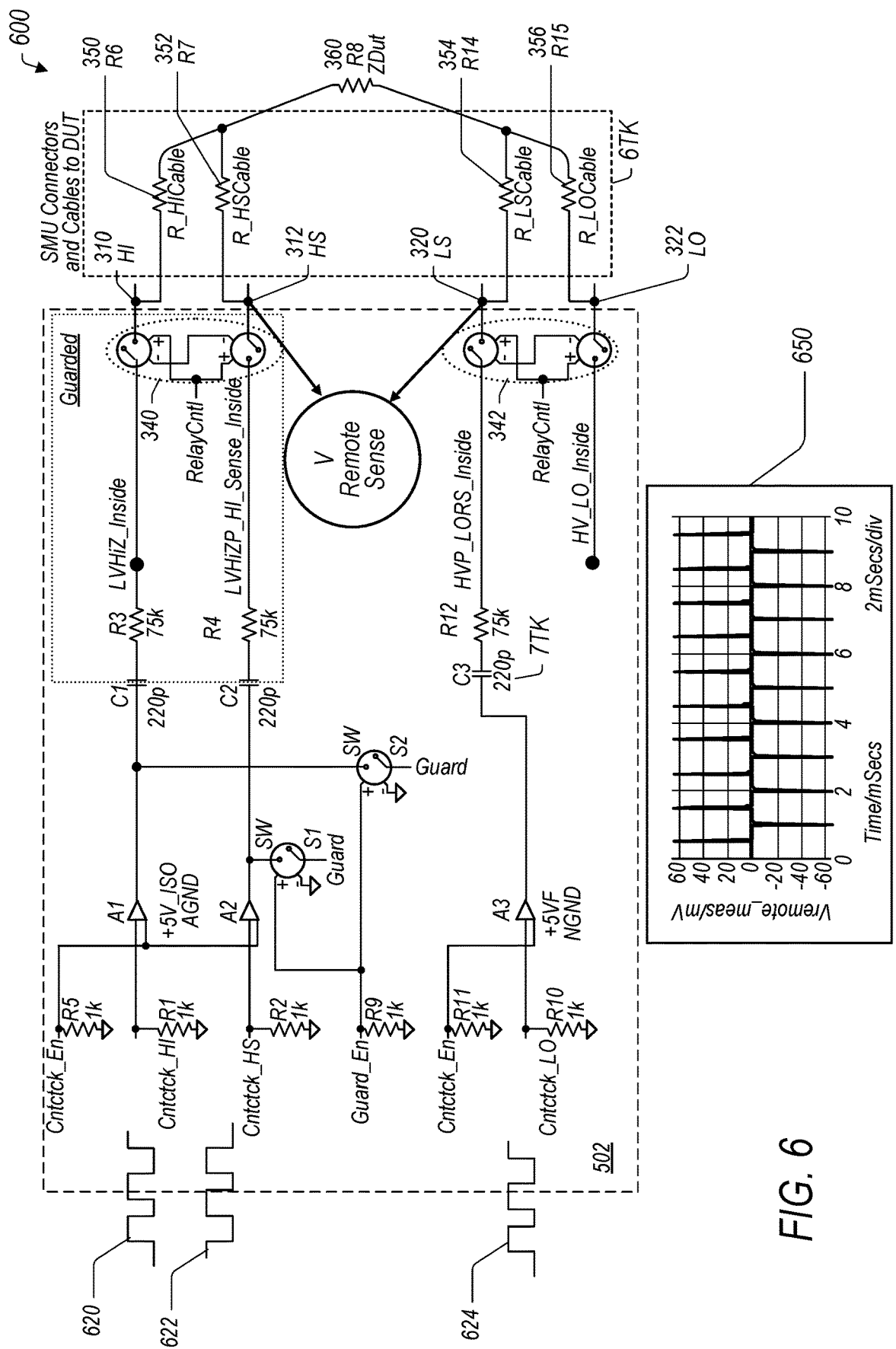
FIG. 6 shows a simplified circuit diagram of an exemplary SMU-based test measurement system with a contact check circuit, illustrating a remote voltage sense measurement for determining cable resistance, according to some embodiments.

As illustrated in FIG. 6, the remote sense voltage (V Remote Sense) may be measured, as indicated, upon having the square waves injected onto Cntctck_HI, Cntctck_HS and HV_Cntctck_LO. The resulting (measured) AC waveforms (650) may be used to infer the DC resistance in the sense path. In other words, by injecting the test signals, e.g. test signals 620, 622, 624, which are shown as square waves in the exemplary system of FIG. 6, the resulting AC waveforms (650) measured at "V remote sense" may be used to infer the DC resistance in the sense path.

Figure 7:
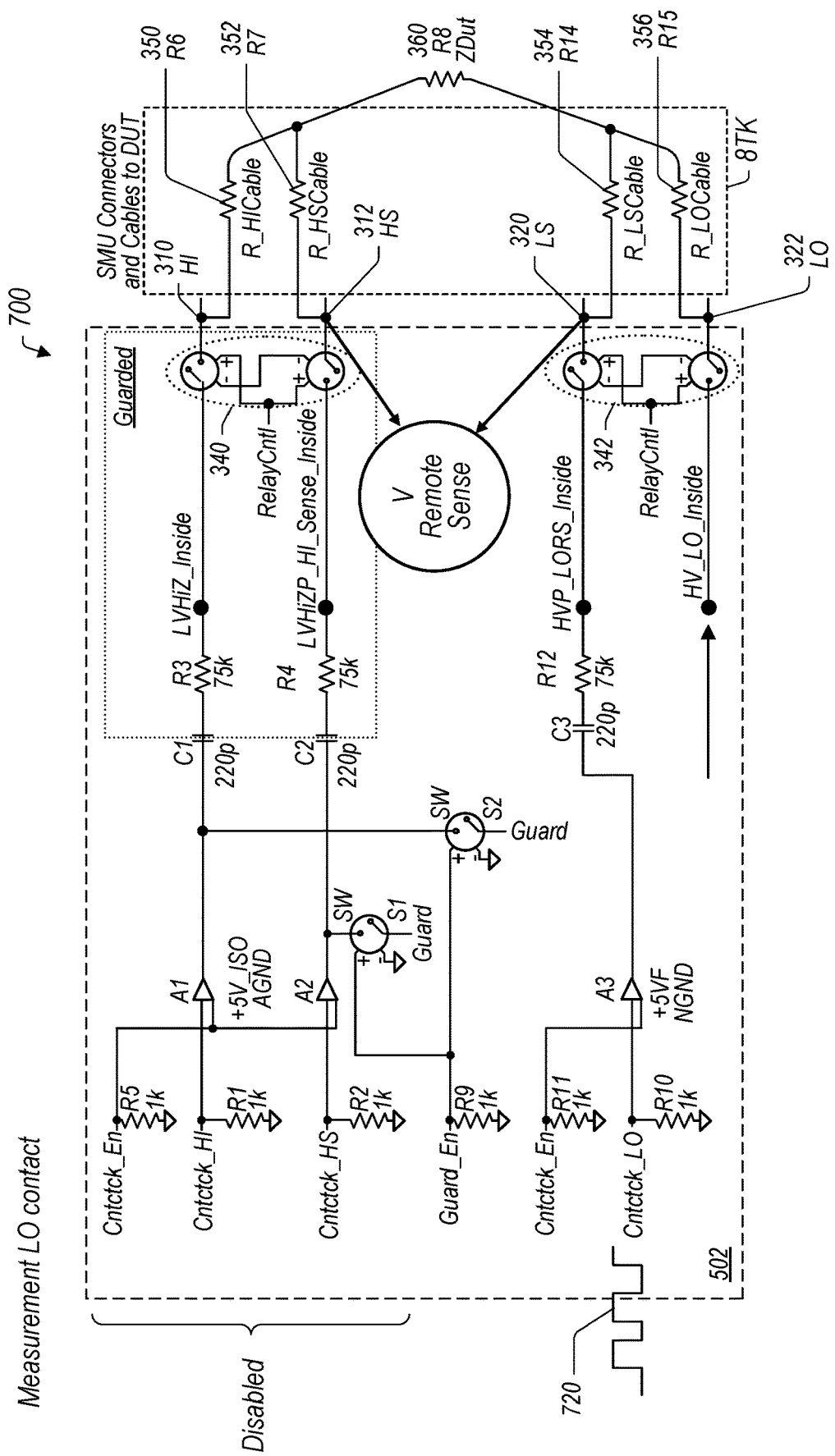
FIG. 7 shows a simplified circuit diagram of an exemplary SMU-based test measurement system with a contact check circuit, illustrating a remote voltage sense measurement for determining LO-side cable resistance, according to some embodiments.

Measurement of the LO-side contact is illustrated in FIG. 7. The example in FIG. 7 shows the measurement of the LO-side contact check for sense path resistance measurement. The HI-side square wave generators may be disabled (turned off) when working on measurement of the LO-side contact check resistance. A test signal, e.g. signal 720 exemplified by the square wave shown in FIG. 7, may be injected into HV_Cntctck_LO as shown, and the A3 buffer may be enabled to allow the test waveform to pass all the way through to the output (LS 320) via the DC isolation path that includes capacitor C3 and resistance R12.

Measurement Method

Figure 8:
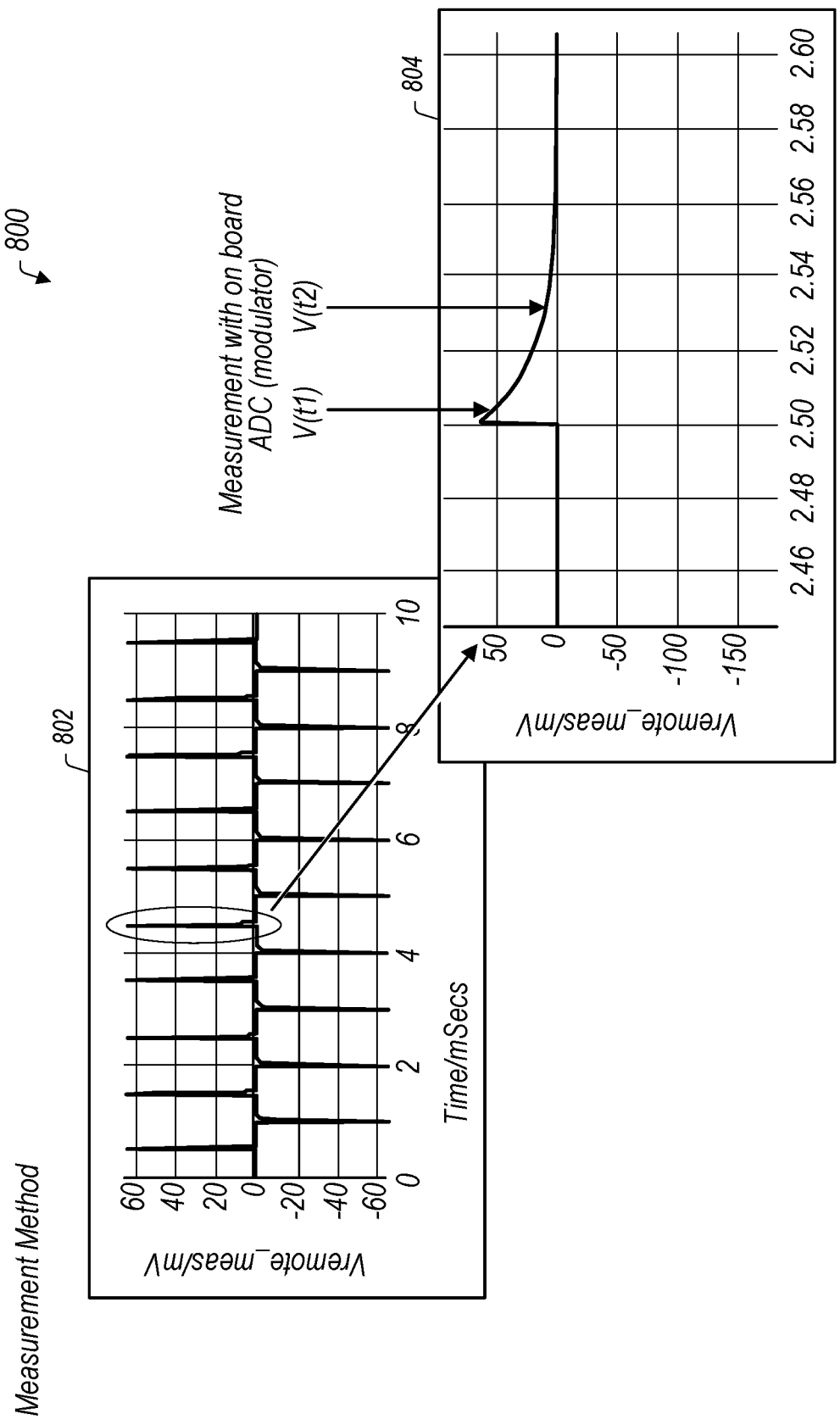
FIG. 8 shows a simplified timing diagram illustrating a voltage waveform representative of the remote sensed voltage measurement results for the measurement configurations illustrated in FIGS. 6 and 7, according to some embodiments.

With respect to FIGS. 6 and 7, the waveform 802 shown in FIG. 8 represents the waveform obtained by measuring the voltage at the nodes indicated by "V remote sense" when A1 and A2 (HI-contact check measurement, FIG. 6) or A3 (LO-contact check measurement, FIG. 7) are sourcing test signals, e.g. square waves of a predetermined frequency. Because C1, R3, R6 (R_HI cable resistance) and C2, R4 and R7 (R_HS cable resistance) on the HI-side contact check, and C3, R12 and R14 (R_LS cable resistance), and R15 (R_LO cable resistance) for LO-side contact check forms an effective RC filter, the injected square waves may be effectively differentiated and appear at "V remote sense" (FIGS. 6 and 7) measurements as a series of RC charge/discharge curves as illustrated in the zoomed-in portion 804 of waveform 802 illustrated in FIG. 8. By taking at least two measurements at "V remote sense", a first measurement, V(t1), at time t1 and a second measurement, V(t2), at time t2, and noting voltage difference between those two voltages, a standard capacitor discharge equation may be used to solve for the total RC resistances as the capacitance values C1, C2, and C3 are known. Because all of the other resistances are also known except for the cable resistances R14 354, R15 356, and R6 350 and R7 352, the unknown total resistances of R14+R15 and R6+R7 may be determined. Those determined values represent the total contact-check cable resistance, which may thus be measured using the AC test signal injection technique as exemplified in FIGS. 6 and 7. In other words, the discharge timing is dependent on the resistance of the sense cable, therefore V1(t1)−V2(t2)∝R_HICable+R_HSCable, for the HI-side contact check, and V1(t1)−V2(t2)∝R_LSCable+R_LO-Cable for the LO-side contact check.

Figure 9:
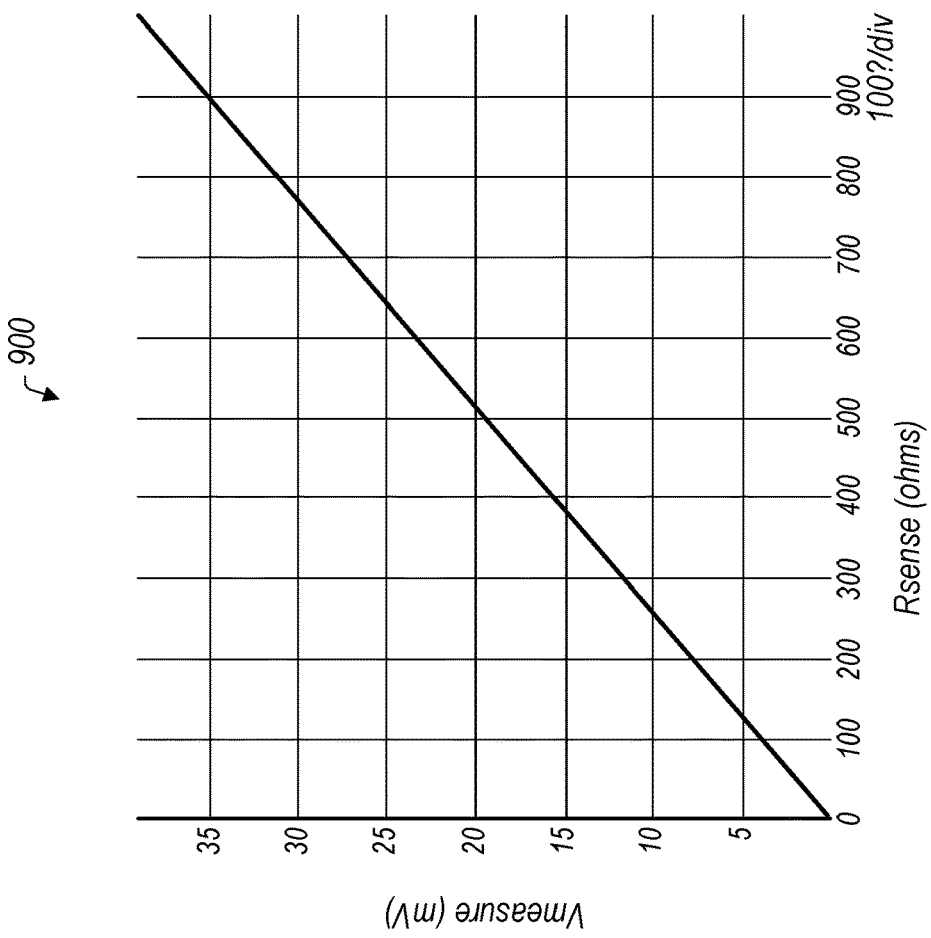
FIG. 9 shows a simplified partial circuit diagram for making sense voltage measurements, and a diagram illustrating the relationship between measured sense voltage and total sense resistance, according to some embodiments.
Figure 9:
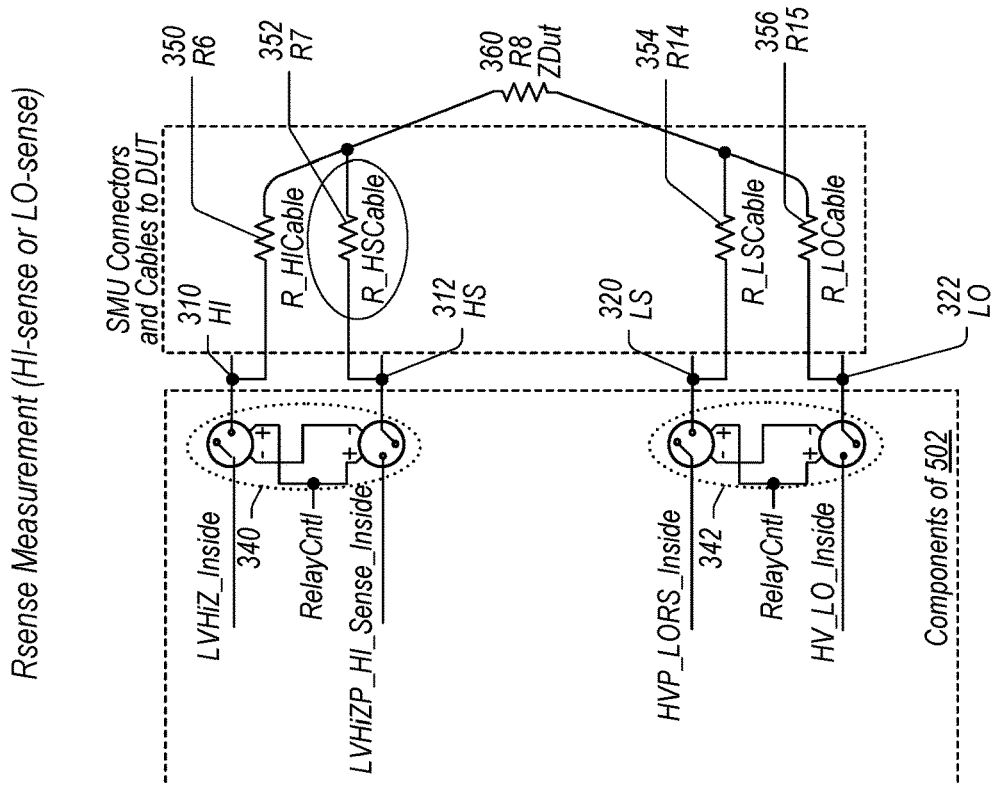

Further pursuant to the above, by holding all other resistances constant while varying just one of the cable resistances (e.g. R_HSCable, i.e. R7 352) and making contact check measurements using the method outlined in FIG. 8, as R7 is varied, a relationship between the measured voltage difference (V(t1)−V(t2) as illustrated in FIG. 8) and the total resistance R6+R7 may be obtained. This is illustrated in FIG. 9. As also previously noted, since R6+R7 represents the total cable resistance for the HI-side, and R14+R15 represents the total cable resistance for the LO-side, this allows identifying the cable resistance for more accurate measurements of the sense voltages.

Frequency-Based Measurement Method

Figure 10:
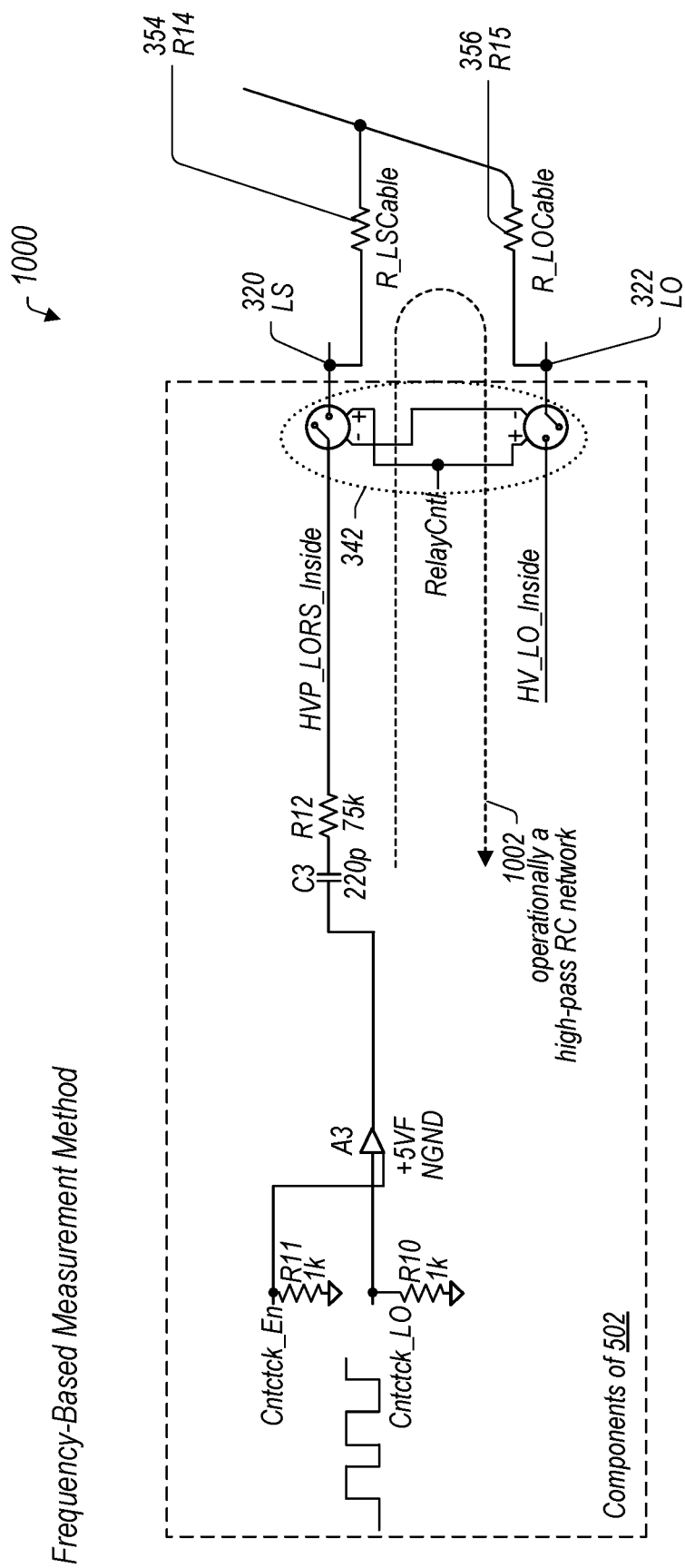
FIG. 10 shows a simplified circuit diagram illustrating a frequency-based method of measuring for measuring cable resistance, according to some embodiments.

Aside from straight time domain measurements, other methods of measuring the cable resistance are also possible and are contemplated. In some embodiments, a frequency domain based measurement method may be employed as illustrated in FIG. 10. The example shown in FIG. 10 is for the LO-side measurement. According to the frequency based approach, a fast Fourier transform (FFT) may be performed on the square wave (or whatever injection test signal is used), and the identified harmonics of the square wave may be used to calculate the 3 db (or specified ratio) frequency, or the gains at different selected harmonics may be compared to each other. This might provide a more accurate while also more complex method as aligned sampling points are no longer required (in contrast to the RC decay method) and the requirement for critical time domain timing is also removed. The frequency based measurement may only be dependent on the sense resistance and sense capacitance (and stray capacitance and stray inductance) in the measurement path.

According to the FFT method of measuring contact resistance, the injection source A3 (in FIG. 10) is used to inject a contact check test signal (the example in system 1000 is a square wave) into an RC filter/network that includes C3, R12 through R14 and R15 (where R14 and R15 are the respective cable resistances that are to be determined). The injected test signal is returned to AGND via the LO terminal 322 into the HV_LO_Inside net. HV_LO_Inside may be switched to AGND during contact check measurement. This signal loop is illustrated as loop 1002 in FIG. 10. The effective bandwidth of the RC filter/network changes when the resistance (R14, R15) is varied. The source A3 injects a test signal (e.g. square wave) having a known frequency into the RC network during the contact check measurement sequence. By measuring the real time AC voltage at HVP_LORS_Inside and HV_LO_Inside, and performing an FFT on the resultant waveforms, a correlation between the amplitude of the measured fundamental frequency and the resistances R14 and R15 may be determined. By first performing measurements with a series of calibrated resistors for R14 and R15, this correlation may be can calibrated to the actual measured resistance. The correlation between R14, R15 and the measured fundamental amplitude exists because they are part of the RC filter/network, and their resistance changes the gain-frequency response of the effective RC filter network. There are numerous other ways to inject a test signal and derive a correlation to the resistance that is to be determined, since in each case the contact/cable resistance that needs to be determined (in this example R14 and R15) is part of an RC filter/network whose gain, bandwidth and response is affected by changes in the values of R14 and/or R15. Due to circuit noise and the small signal nature of the measurements, the measurements may be repeated to obtain a time-averaged result in order to increase the precision and accuracy of the measurements.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

We claim:

1. A system for measuring cable resistance, the system comprising:
   a measurement circuit configured to provide a stimulus signal to a device under test (DUT) and measure a DUT signal developed responsive to at least the stimulus signal; and
   a contact check circuit configured to superimpose a test signal over the stimulus signal to cause the DUT signal to be developed responsive additionally to the test signal;
   wherein the measurement circuit is further configured to derive respective resistances of one or more paths coupling the measurement circuit to the DUT, based at least on the DUT signal.

2. The system of claim 1, wherein the measurement circuit comprises a source measure unit.

3. The system of claim 1, wherein the stimulus signal is a regulated voltage and the DUT signal is a sense voltage.

4. The system of claim 1, wherein the test signal comprises square waves.

5. The system of claim 1, wherein the test signal has a specified frequency.

6. The system of claim 1, wherein the measurement circuit is further configured to analyze harmonics of the DUT signal to determine a correlation between an amplitude of a measured fundamental frequency of the DUT signal and the respective resistances of the one or more paths.

7. The system of claim 1, wherein the contact check circuit comprises a resistive-capacitive (RC) network coupling to the respective resistances of the one or more paths.

8. The system of claim 1, wherein the one or more paths comprise cables.

9. The system of claim 1, wherein the contact check circuit comprises a guard circuit configured to prevent leakage current in the one or more paths during measurement of the DUT signal when the test signal is not superimposed over the stimulus signal.

10. A system for performing accurate voltage, current, and load measurements, the system comprising:
    a measurement device configured to:
      couple to a device under test (DUT) via one or more cables;
      provide a stimulus signal the DUT; and
      measure a DUT signal, wherein the DUT signal is developed responsive to at least the stimulus signal; and
    a contact check circuit configured to superimpose a test signal over the stimulus signal to cause the DUT signal to be developed responsive additionally to the test signal;
    wherein the measurement device is further configured to derive a resistance of the one or more cables based at least on the DUT signal.

11. The system of claim 10, wherein the stimulus signal is a regulated voltage and the DUT signal is a sense voltage.

12. The system of claim 10, wherein the test signal comprises square waves having a specified frequency.

13. The system of claim 10, wherein the measurement device is further configured to analyze harmonics of the DUT signal to determine a correlation between an amplitude of a measured fundamental frequency of the DUT signal and the resistance of the one or more cables.

14. The system of claim 10, wherein the contact check circuit comprises a resistive-capacitive (RC) network coupling to the one or more cables.

15. The system of claim 10, wherein the contact check circuit comprises a guard circuit configured to prevent leakage current in the one or more paths during measurement of the DUT signal when the test signal is not superimposed over the stimulus signal.

16. A contact check measurement circuit comprising:
    a set of inputs configured to receive respective input signals;
    circuitry configured to generate test signals corresponding to the respective input signals;
    a set of outputs configured to superimpose the test signals over a stimulus signal provided to a device under test (DUT); and
    processing circuitry configured to determine a resistance of one or more coupling paths to the DUT based at least on a DUT signal, wherein the DUT signal is developed responsive to the stimulus signal and the test signals.

17. The contact check measurement circuit of claim 16, further comprising:
    a guard circuit configured to prevent leakage current in the one or more coupling paths during measurement of the DUT signal when the test signals are not superimposed over the stimulus signal.

18. The contact check measurement circuit of claim 16, wherein the test signals comprise square waves having a specified frequency.

19. The contact check measurement circuit of claim 16, wherein the stimulus signal is a regulated voltage and the DUT signal is a sense voltage.

20. The contact check measurement circuit of claim 16, further comprising:
    a resistive-capacitive (RC) network coupling to the one or more coupling paths.

* * * * *